United States Patent
Chao et al.

(10) Patent No.: US 8,697,462 B2
(45) Date of Patent: *Apr. 15, 2014

(54) MANUFACTURING METHOD OF LIGHT EMITTING DEVICE HAVING AUTO-CLONING PHOTONIC CRYSTAL STRUCTURES

(71) Applicant: National Tsing Hua University, Hsinchu (TW)

(72) Inventors: Shiuh Chao, Hsinchu (TW); Hao-Min Ku, Hsinchu (TW); Chen-Yang Huang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/913,093

(22) Filed: Jun. 7, 2013

(65) Prior Publication Data

US 2013/0273681 A1  Oct. 17, 2013

Related U.S. Application Data

(62) Division of application No. 13/150,571, filed on Jun. 1, 2011, now Pat. No. 8,486,738.

(30) Foreign Application Priority Data

Jan. 7, 2011  (TW) ............................. 100100612 A

(51) Int. Cl.
*H01L 33/00*  (2010.01)
*H01L 31/00*  (2006.01)

(52) U.S. Cl.
USPC ................ 438/29; 438/32; 438/34; 438/759; 257/77; 257/94; 257/98; 257/99; 257/E33.001; 257/E33.023; 257/E33.064; 257/E33.069

(58) Field of Classification Search
USPC ........ 438/29, 32, 34, 759; 257/77, 94, 98, 99, 257/E33.001, E33.023, E33.064, E33.069
See application file for complete search history.

(56) References Cited

U.S. PATENT DOCUMENTS

| | | | |
|---|---|---|---|
| 7,498,607 B2 | 3/2009 | Tsai et al. | |
| 7,663,153 B2 | 2/2010 | Huang et al. | |
| 8,486,738 B2 * | 7/2013 | Chao et al. | 438/29 |
| 2005/0082548 A1 * | 4/2005 | Sakong et al. | 257/79 |
| 2009/0114935 A1 * | 5/2009 | Huang et al. | 257/98 |
| 2010/0219437 A1 * | 9/2010 | Usuda et al. | 257/98 |
| 2011/0068351 A1 | 3/2011 | Donofrio | |

* cited by examiner

*Primary Examiner* — Dao H Nguyen

(74) *Attorney, Agent, or Firm* — Muncy, Geissler, Olds & Lowe, P.C.

(57) ABSTRACT

A light emitting device having auto-cloning photonic crystal structures comprises a substrate, a first semiconductor layer, an active emitting layer, a second semiconductor layer and a saw-toothed multilayer film comprising auto-cloning photonic crystal structures. The saw-toothed multilayer film provides a high reflection interface and a diffraction mechanism to prevent total internal reflection and enhance light extraction efficiency. The manufacturing method of the light emitting device having auto-cloning photonic crystal structures is presented here.

14 Claims, 15 Drawing Sheets

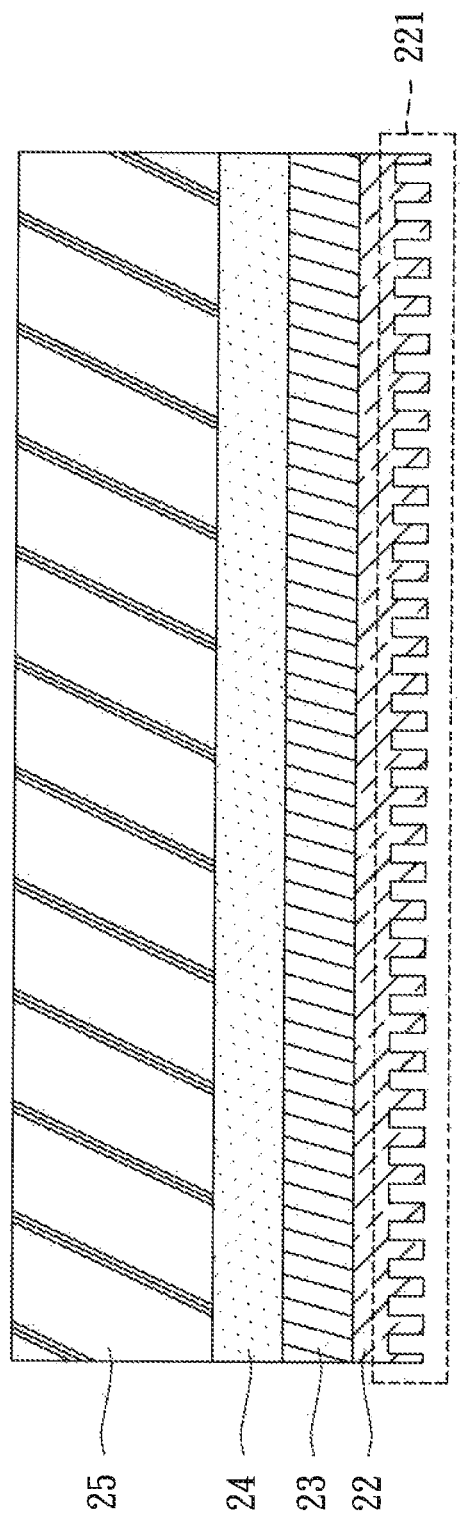

MANUFACTURING METHOD OF LIGHT EMITTING DEVICE HAVING AUTO-CLONING PHOTONIC CRYSTAL STRUCTURES

CROSS REFERENCE TO RELATED APPLICATIONS

This application is a Divisional of co-pending application Ser. No. 13/150,571, filed on Jun. 1, 2011, for which priority is claimed under 35 U.S.C. §120; and this application claims priority of Application No. 100100612 filed in Taiwan, R.O.C. on Jan. 7, 2011 under 35 U.S.C. §119, the entire contents of all of which are hereby incorporated by reference.

BACKGROUND OF THE INVENTION

1. Field of the Invention

The present invention relates to a manufacturing method of a light emitting device having auto-cloning photonic crystal structures, and more particularly to a manufacturing method of a light emitting device having auto-cloning photonic crystal structures marked by higher light extraction efficiency.

2. Description of the Prior Art

Solid-state light-emitting devices have advantages of longer life time, shorter response time, compact dimensions and lower driving voltage, etc. Especially gallium nitride light emitting devices become mainstream of new light sources of next generation, because the energy band gap of gallium nitride is relatively wide enabling gallium nitride to emit light of short wavelength and emit white light by combining with fluorescence. A sapphire is commonly used as a substrate of a gallium nitride light emitting device of the prior art. Because the sapphire is substantially transparent for visible light, light generated by the light emitting device emit omnidirectionally and does not concentrate to output at one surface, resulting in lower luminescence efficiency at the surface. Therefore, there has been increasing demand for developing light emitting device with high luminescence efficiency.

A prior art manufacturing method of light emitting diodes improves luminescence efficiency by disposing a reflecting surface on a substrate of a light emitting diode for reflecting lights emitted toward the substrate. However, the light reflected by the reflecting surface is continuously reflected inside the light emitting diode, because total internal reflection has occurred. The reflected light is eventually absorbed by the material of the light emitting diode and converted to heat, which impedes the luminescence efficiency of the light emitting diode. Another prior art method for enhancing luminescence efficiency embeds a reflecting surface in a semiconductor layer of a light emitting diode for the reflecting surface to be closer to an active layer of the light emitting diode by using Epitaxial Lateral Over-Growth (ELOG). However, the reflecting surface must be etched to expose the semiconductor layer for the following manufacturing process of the light emitting diode by using ELOG. Thus, the area of the reflecting surface is decreased and the luminescence efficiency is impeded.

SUMMARY OF THE INVENTION

The present invention is directed to a manufacturing method of a light emitting device having auto-cloning photonic crystal structures comprising a saw-toothed multilayer film, which may help to prevent total internal reflection and increase the luminescence efficiency of the light emitting diode.

According to an embodiment, a manufacturing method of a light emitting device having auto-cloning photonic crystal structures comprising: providing a first carrier board; disposing a first semiconductor layer on said first carrier board; disposing an active emitting layer on said first semiconductor layer; disposing a second semiconductor layer on said active emitting layer; disposing a saw-toothed multilayer film on said second semiconductor layer by using a process of manufacturing auto-cloning photonic crystal structures; disposing a substrate on said saw-toothed multilayer film; and disposing a first electrode and a second electrode on said first semiconductor layer and said second semiconductor layer respectively.

The objective, technologies, features and advantages of the present invention will become more apparent from the following description in conjunction with the accompanying drawings, wherein certain embodiments of the present invention are set forth by way of illustration and examples.

BRIEF DESCRIPTION OF THE DRAWINGS

FIG. 2A to FIG. 2G are schematic cross-sectional views illustrating the manufacturing process flow of a light emitting device having auto-cloning photonic crystal structures according to an embodiment of the present invention;

DESCRIPTION OF THE PREFERRED EMBODIMENT

Figure 1:
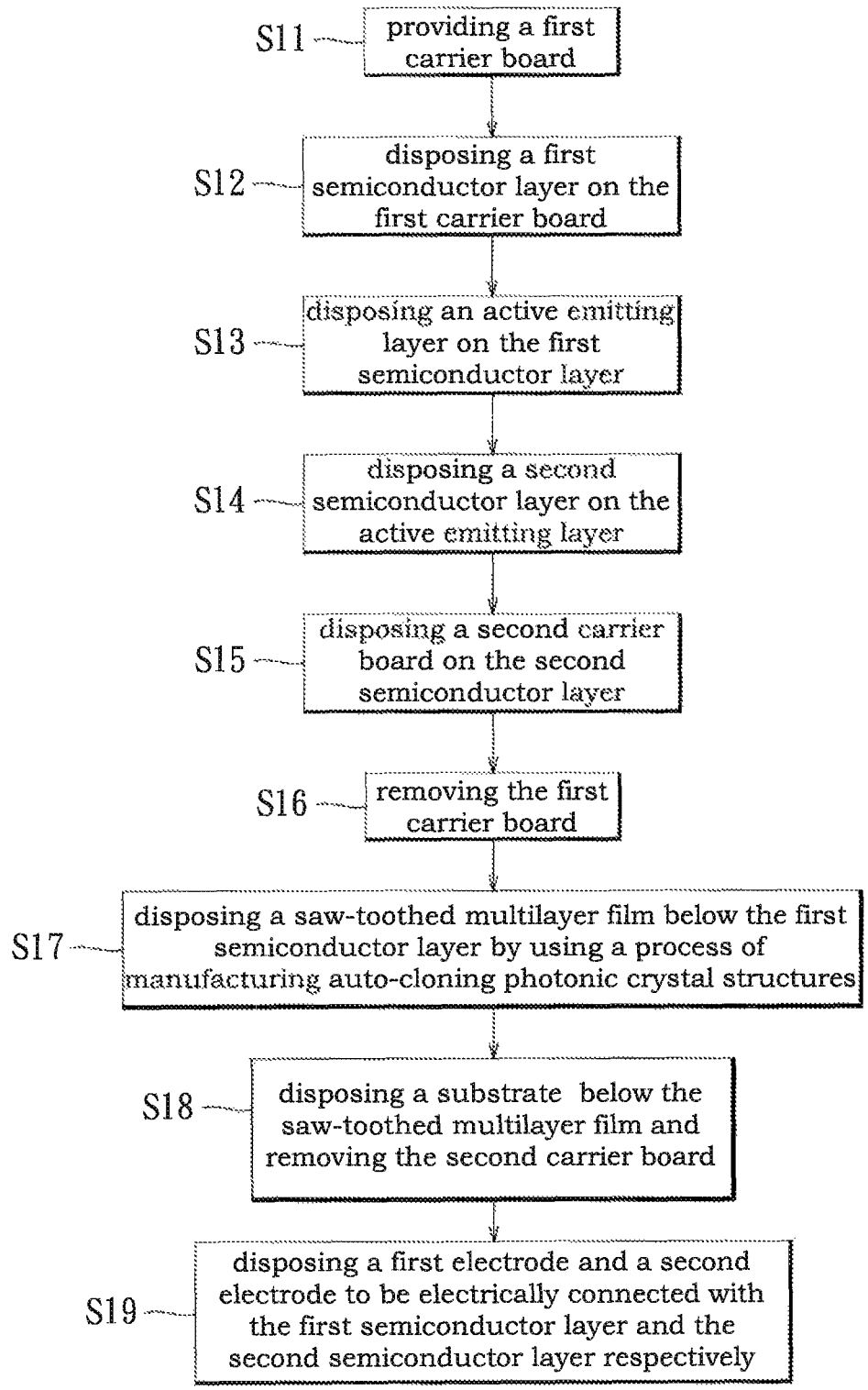
FIG. 1 is a manufacturing process flow of a light emitting device having auto-cloning photonic crystal structures according to an embodiment of the present invention.
Figure 2A:
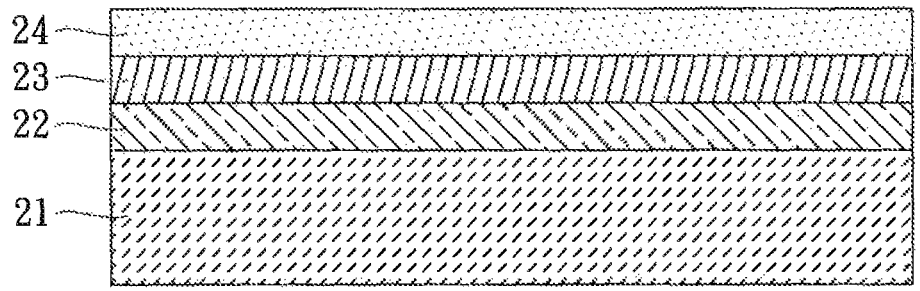

Referring to FIG. 1 and FIG. 2A to FIG. 2G simultaneously, FIG. 1 is a manufacturing process flow (Step S11 through Step S19) of a light emitting device having auto-cloning photonic crystal structures according to an embodiment of the present invention. FIG. 2A to FIG. 2G are schematic cross-sectional views illustrating the manufacturing process flow of the light emitting device having auto-cloning photonic crystal structures according to the embodiment of the present invention. FIG. 2A corresponds to step S11 to Step S14 in FIG. 1. Step S11 is providing a first carrier board 21, and material of the first carrier board 21 may comprise glass, sapphire, SiC, Si, GaAs, LiAlO$_2$, LiGaO$_2$ or organic materials. Step S12 is disposing a first semiconductor layer 22 on the first carrier board 21. Step S13 is disposing an active emitting layer 23 on the first semiconductor layer 22. Step S14 is disposing a second semiconductor layer 24 on the active emitting layer 23. The first semiconductor layer 22, the active emitting layer 23 and the second semiconductor layer 24 in step S12 through step S14 may be disposed by using chemical vapor deposition, molecular beam epitaxy or chemical liquid deposition.

Figure 2B:
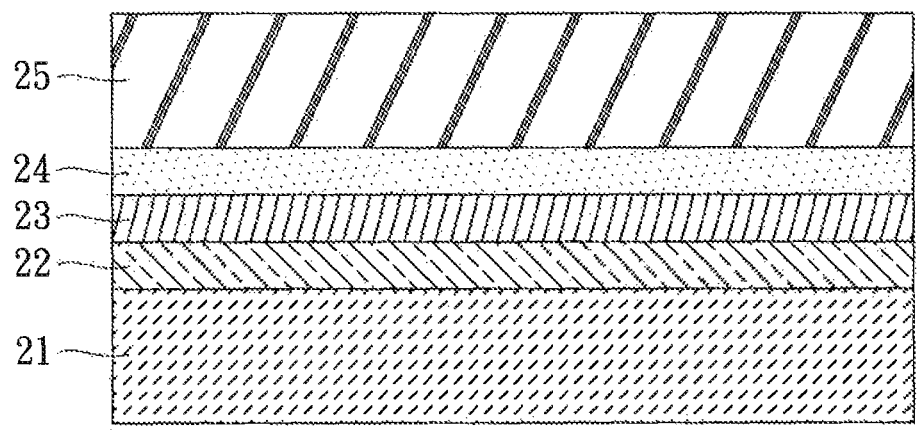
Figure 2C:
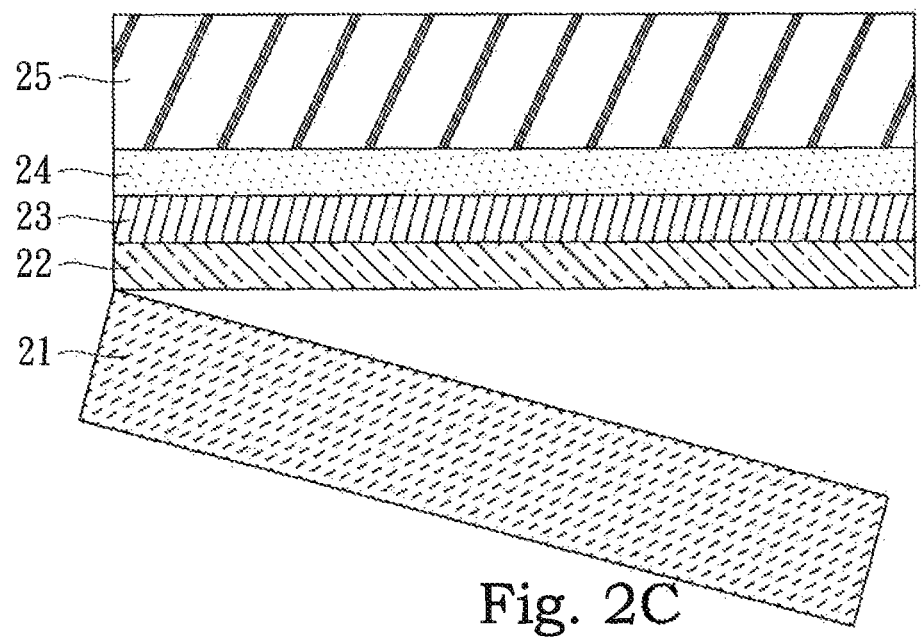
Figure 2E:
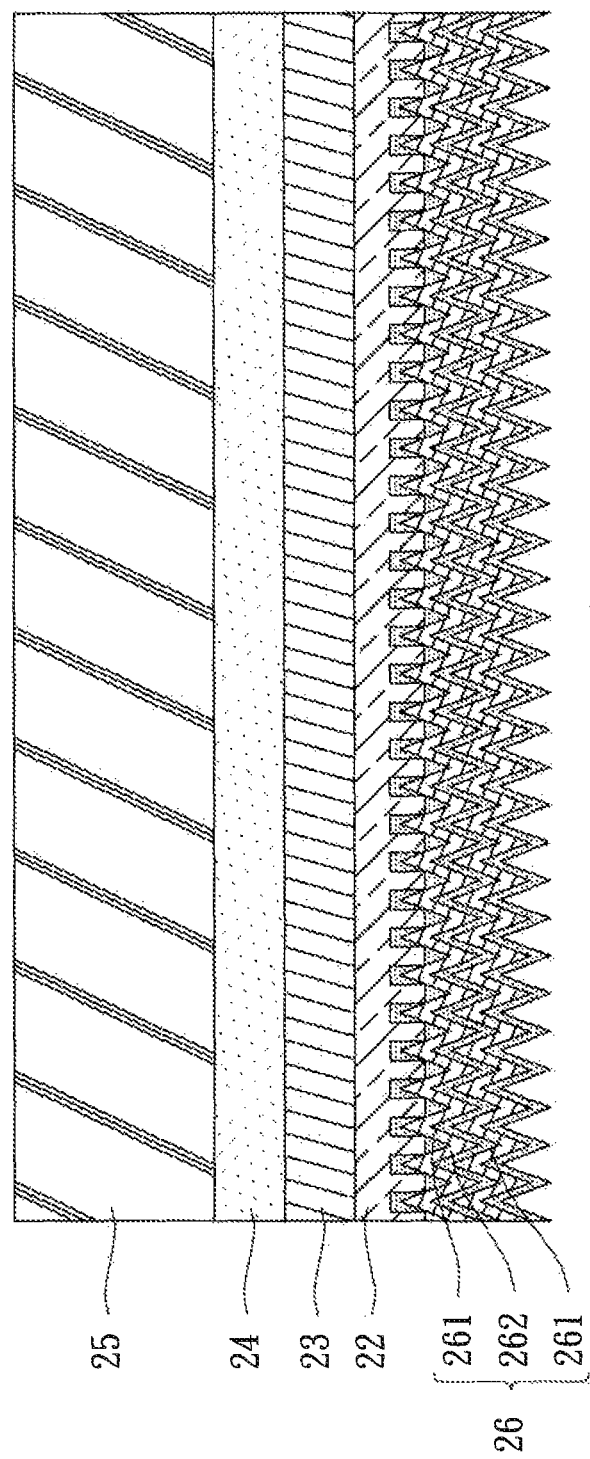

FIG. 2B corresponds to step S15 in FIG. 1. Step S15 is disposing a second carrier board 25 on the second semiconductor layer 24. The second carrier board 25 is attached on the second semiconductor layer 24 by using a temporary bonding agent, and material of the second carrier board 25 may comprise glass, sapphire, SiC, Si, GaAs, LiAlO$_2$, LiGaO$_2$ or organic materials. Step S16 is removing the first carrier board 21, as shown in FIG. 2C. The first carrier board 21 can be but not limited to be removed by using dry etching, wet etching or laser peeling. Step S17 is disposing a saw-toothed multilayer film 26 below the first semiconductor layer 22 by using a process of manufacturing auto-cloning photonic crystal structures. In one embodiment of the present invention, the process of manufacturing auto-cloning photonic crystal structures may comprise: disposing a comb pattern 221 at the lower surface of the first semiconductor layer 22 by means of photolithography, ion-beam etching, nano-imprinting or laser etching, as shown in FIG. 2D; and disposing the saw-toothed multilayer film 26 by using a thin-film process, as shown in FIG. 2E. The saw-toothed multilayer film 26 is constructed by alternately stacking at least two materials with different indices of refraction. In one embodiment of the present invention, the saw-toothed multilayer film 26 is formed by alternately stacking a material layer of first index of refraction 261 and a material layer of second index of refraction 262. The material layer of first index of refraction 261 and the material layer of second index of refraction 262 may be selected from a group consisting of TiO$_2$, Ta$_2$O$_5$, Nb$_2$O$_5$, CeO$_2$, ZnS, ZnO, Si, SiO$_2$ and MgF$_2$.

It should be noted that the above mentioned thin-film process may be an ion beam sputtering process, a radio frequency magnetron sputtering process, an evaporation deposition process or a chemical vapor deposition, which collaborates with a low power etching process to modify the shape of the material layer of first index of refraction 261 and the material layer of second index of refraction 262 into saw-toothed shape. The process of manufacturing auto-cloning photonic crystal structures has advantages of conventional thin-film process, such as mass production capability, relatively simple process, low production cost, capability of producing large area films and etc. Also the thickness of thin film may be controlled precisely. The process of manufacturing auto-cloning photonic crystal structures meets the requirement of lattice constant arrangement and the selection of index of refraction.

Figure 2F:
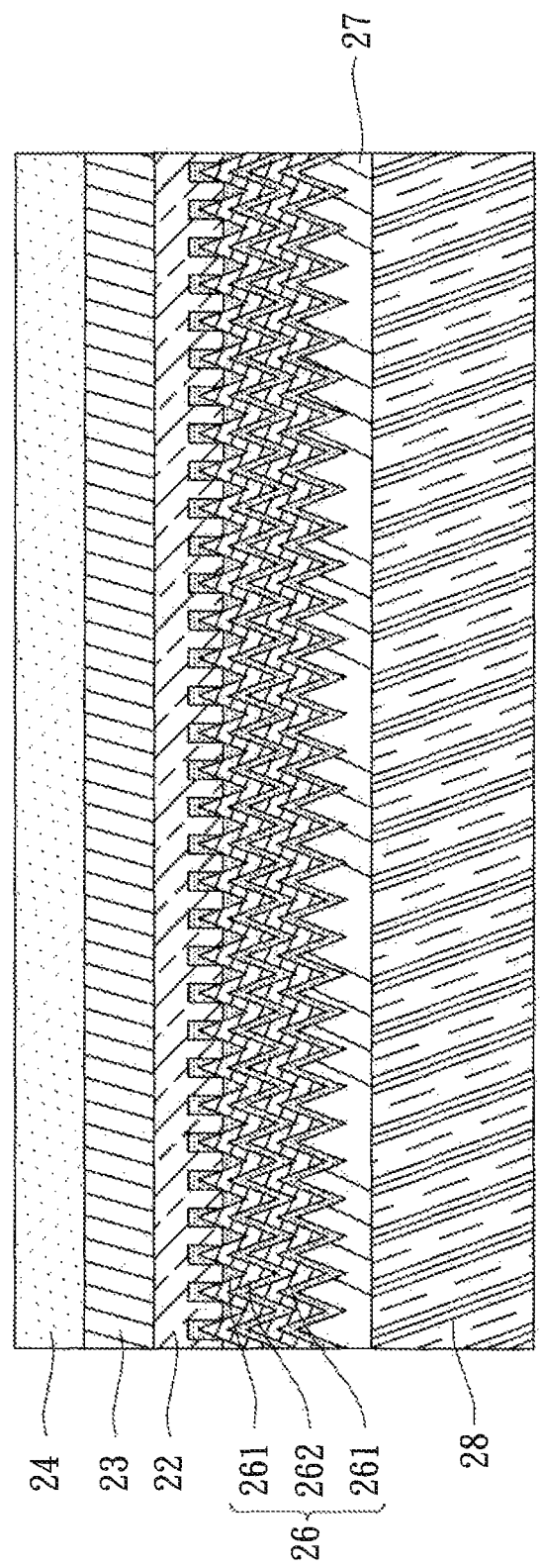
Figure 2G:
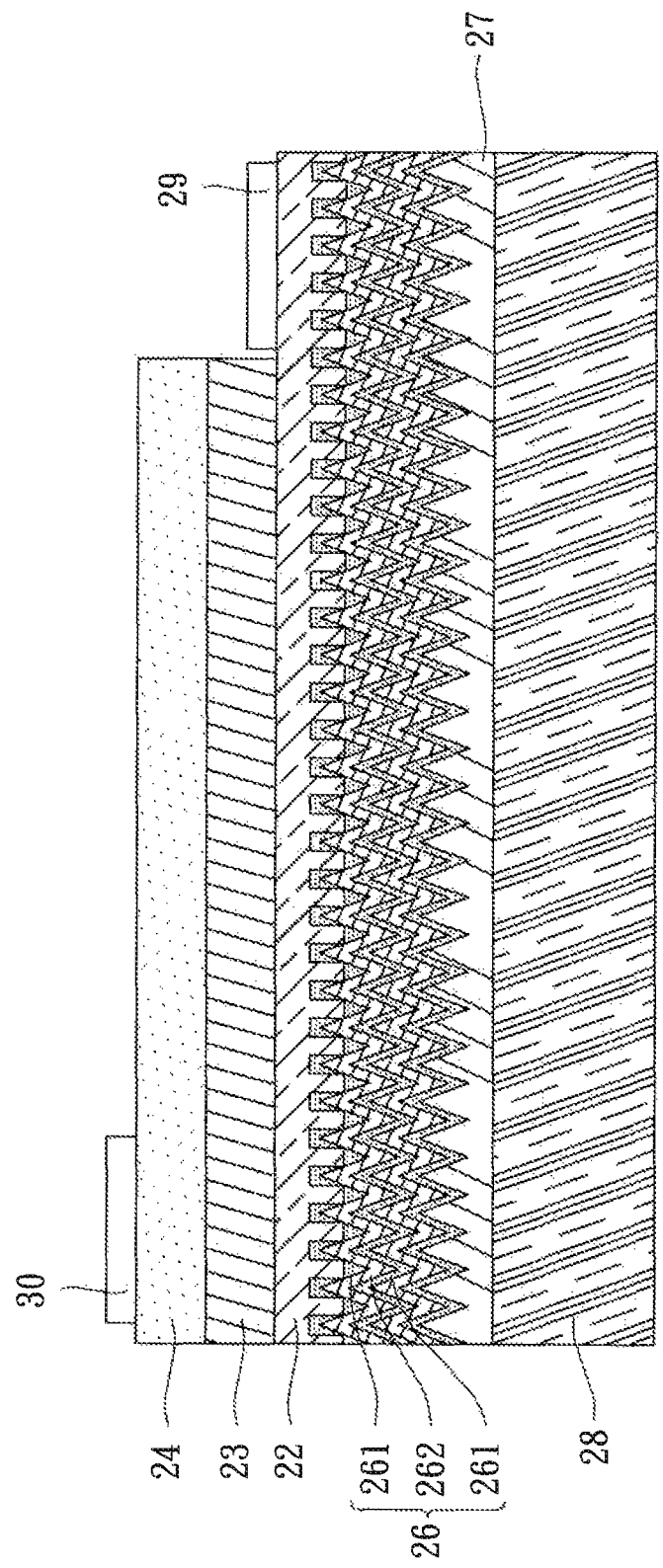

Continuing the above description, step S18 is disposing a substrate 28 below the saw-toothed multilayer film 26 by using an adhesive layer 27, and then removing the second carrier board 25, as shown in FIG. 2F. Preferably, the substrate 28 may comprise a material with high thermal conductivity, such as Cu or Al and etc., to enhance thermal dissipation. Step S19 is disposing a first electrode 29 and a second electrode 30 electrically connected with the first semiconductor layer 22 and the second semiconductor layer 24 respectively as shown in FIG. 2G. The first electrode 29 is disposed by removing parts of the second semiconductor layer 24 and the active emitting layer 23 to expose a part of the first semiconductor layer 22 via photolithography or laser etching, and then disposing the first electrode 29 and the second electrode 30 by using sputtering or evaporation. In another embodiment of the present invention, the manufacturing process flow of the light emitting device having auto-cloning photonic crystal structure further comprises a process disposing a transparent conducting layer (not shown) between the first semiconductor layer 22 and the first electrode 29 and/or between the second semiconductor layer 24 and the second electrode 30 for spreading the current evenly to enhance luminescence efficiency. It should be understood that the transparent conductive layer is selected from a group consisting of IZO, ITO, SnO$_2$, TiO$_2$, AZO, InO and ZnO. It should be noted that when the second carrier board 25 is transparent with respect to light emitted by the active emitting layer 23, removing the second carrier board 25 is not necessary in step S18.

As shown in FIG. 2G, in a light emitting device having auto-cloning photonic crystal structures, the saw-toothed multilayer film 26 may be a three-dimensional photonic crystal, having lateral and longitudinal periodicity. The lateral periodicity provides a diffraction mechanism for confining light within a total reflection angle and the longitudinal periodicity provides an interface with high reflection. Therefore, it is not necessary to dispose an omni-directional reflector (ODR), or a distributed bragg reflector (DBR) inside the light emitting device according to the present invention. It is also not necessary to texture a light outputting surface of the light emitting device while luminescence efficiency is still enhanced. Referring to FIG. 2G, it should be noted that the saw-toothed multilayer film 26 entirely covers the substrate 28, and the photonic bandgap of the photonic crystal structure in the saw-toothed multilayer film 26 results in omni-reflection. Also, light within the photonic crystal is diffracted and the direction of light is changed, resulting in that a large portion of light is confined within a total reflection angle, whereby luminescence efficiency is enhanced. Light emitted by the active emitting layer 23 interact with the saw-toothed multilayer film 26 without passing through the substrate 28, thereby enhancing the luminescence efficiency effectively. Because the luminescence efficiency of the light emitting device is related to the reflection of the saw-toothed multilayer film 26, the saw-toothed multilayer film 26 suitable for a certain range of wavelength of light is determined by at least one of the period, the thickness, number of layers or index of refraction of the saw-toothed multilayer film 26. The process flow disclosed in FIG. 1 may be interchanged according to process requirements.

It should be noted that in the light emitting device having auto-cloning photonic crystal structures according to FIG. 2G, the first semiconductor layer 22 comprises an n-type III-V semiconductor material, such as n-GaN; the second semiconductor layer 24 comprises a p-type III-V semiconductor material, such as p-GaN. The active emitting layer 23 may comprise a single quantum layer or a multi-quantum layer structure, and the composition within the quantum layer depends on the desired wavelength of emitted light. It is understood that the material of the first semiconductor layer 22 and the second semiconductor layer 24 may be exchanged with each other, i.e. the first semiconductor layer 22 comprises a p-type III-V semiconductor material, and the second semiconductor layer 24 comprises an n-type semiconductor material.

Figure 3:
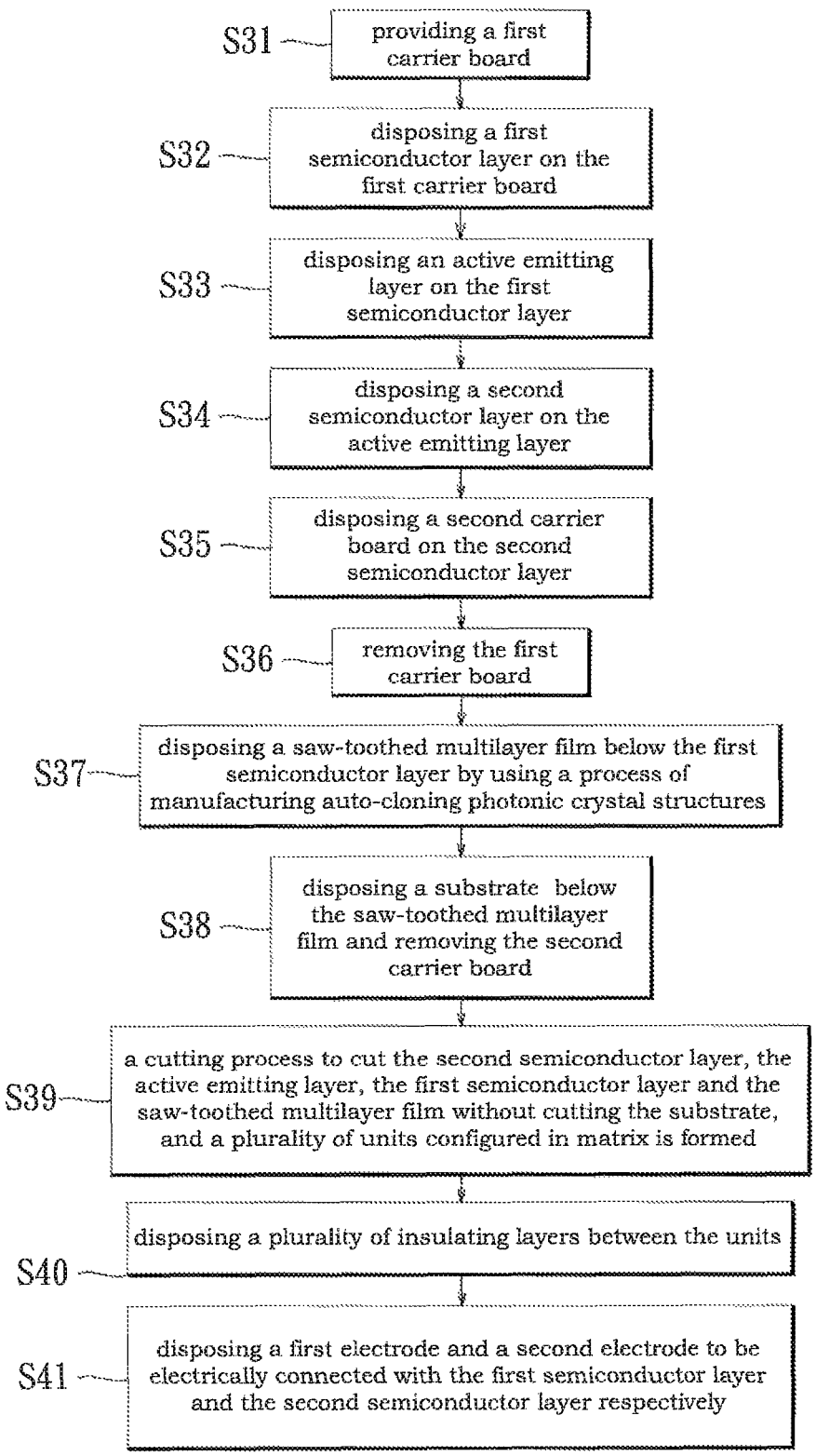
FIG. 3 is a manufacturing process flow of a light emitting device having auto-cloning photonic crystal structures according to another embodiment of the present invention.
Figure 4A:
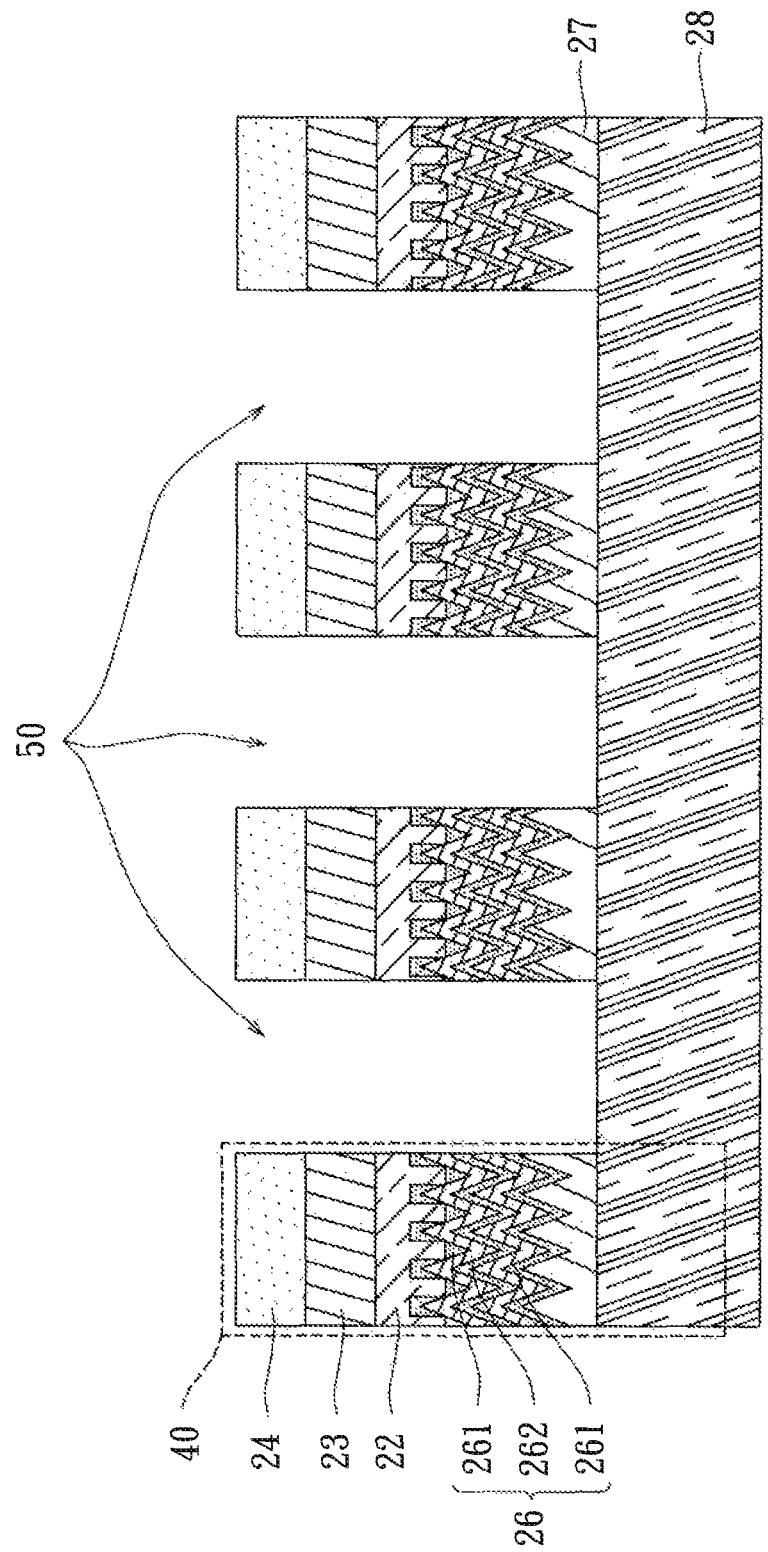
FIG. 4A and FIG. 4B are schematic cross-sectional views illustrating the manufacturing process flow of a light emitting device having auto-cloning photonic crystal structures according to another embodiment of the present invention.
Figure 4B:
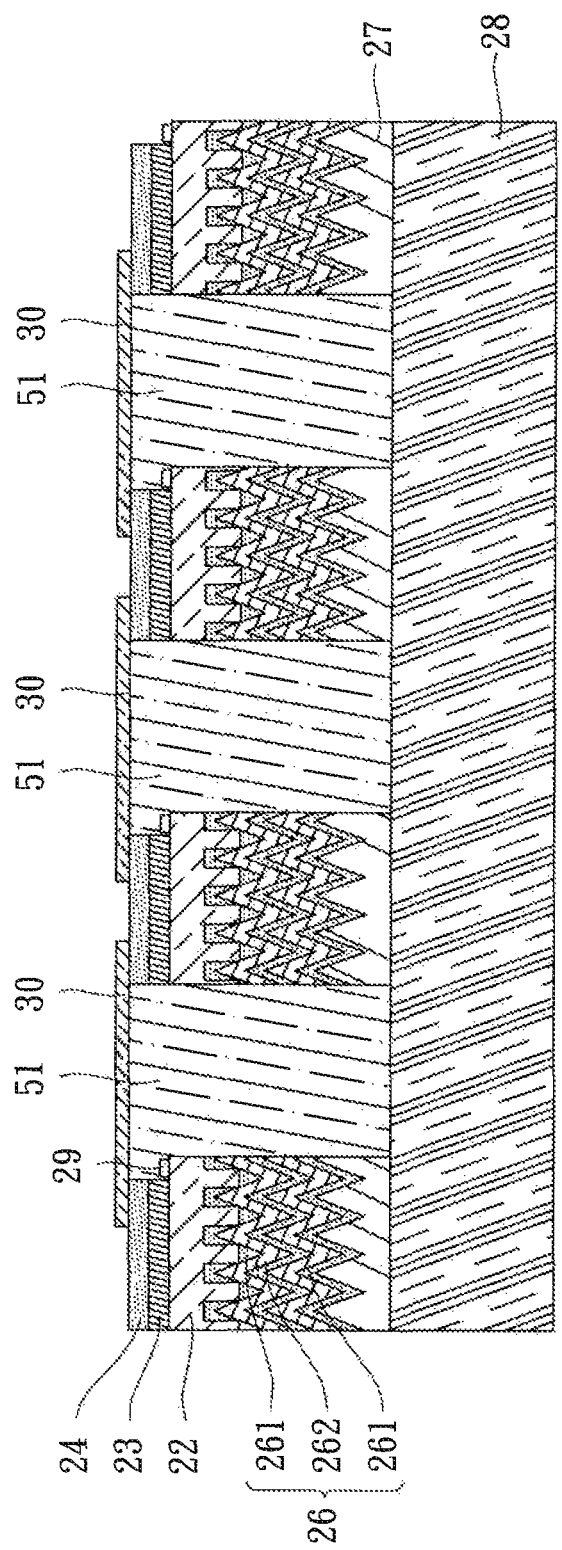

Referring to FIG. 3, FIG. 2A to FIG. 2F and FIG. 4A to FIG. 4B, FIG. 3 is a manufacturing process flow of a light emitting device having auto-cloning photonic crystal structures according to another embodiment of the present invention, and is particularly for forming a light emitting device having auto-cloning photonic crystal structures comprising units arranged in matrix. The process flow comprises step S31 through step S41 in FIG. 3. In FIG. 3, step S31 to step S38 and the corresponding schematic cross-sectional views are the same as the above mentioned step S11 to S18 in FIG. 1 and the corresponding FIG. 2A to FIG. 2F, and the same detail descriptions are omitted herein. FIG. 4A corresponds to step S39 in FIG. 3. Step 39 is a cutting process for forming a plurality of trenches 50 before the first electrode 29 and the second electrode 30 are disposed. Trenches 50 are formed such that the second semiconductor layer 24, the active emitting layer 23, the first semiconductor layer 22 and the saw-toothed multilayer film 26 are etched away, while the substrate 28 is left unetched. Trenches 50 defines a plurality of units 40 configured in matrix. The following step S40 is disposing a plurality of insulating layers 51 between the units 40, as shown in FIG. 4B. The insulating layers 51 comprise insulating materials. The following step S41 is disposing the first electrode 29 and the second electrode 30 on each unit 40 electrically connected to the first semiconductor layer 22 and the second semiconductor layer 24 respectively, wherein each second electrode 30 covers each insulating layer 51. According to FIG. 2G and FIG. 4B, the light emitting device having auto-cloning photonic crystal structures and manufacturing method thereof of the present invention may not only be a single device of small or large size, but also be a matrix device.

Figure 5:
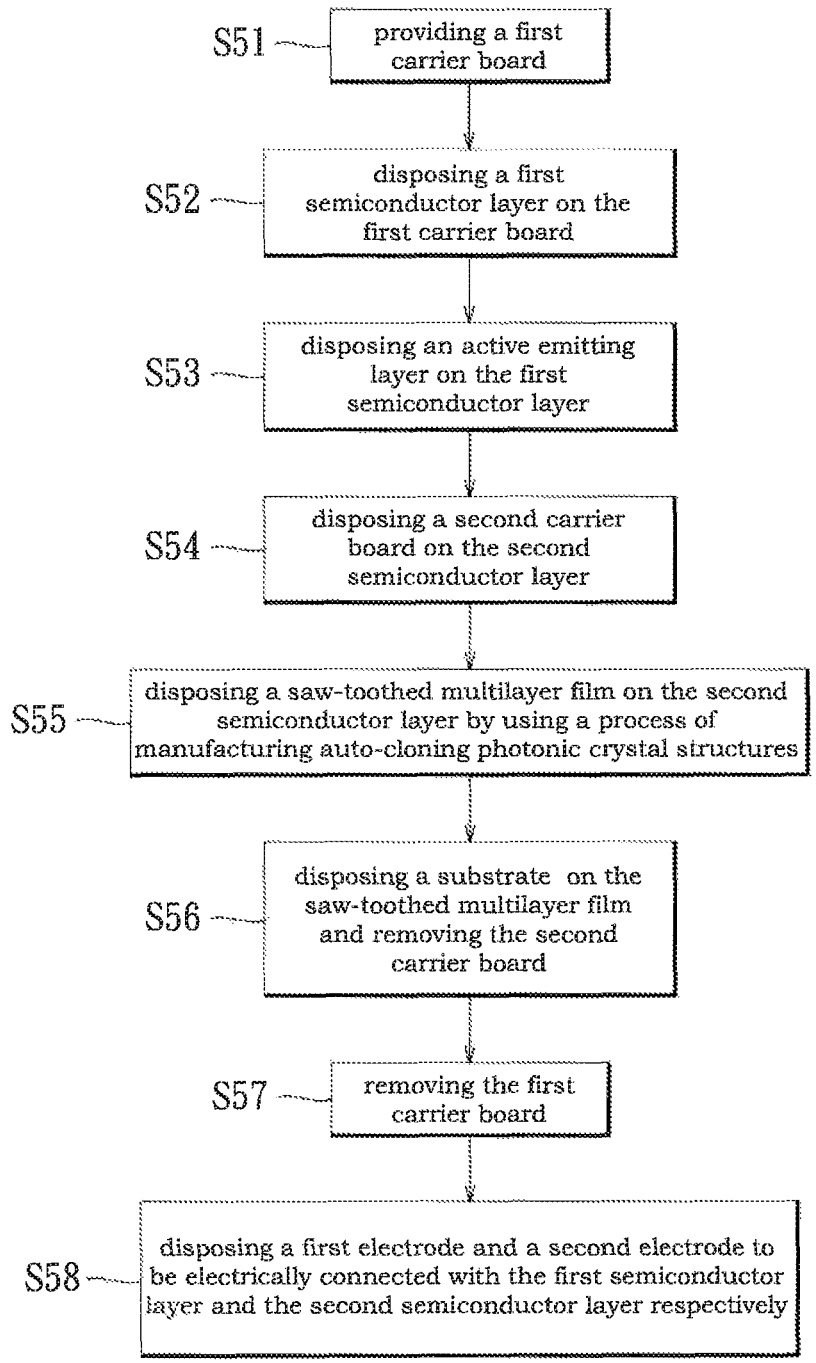
FIG. 5 is a manufacturing process flow of a light emitting device having auto-cloning photonic crystal structures according to another embodiment of the present invention.
Figure 6A:
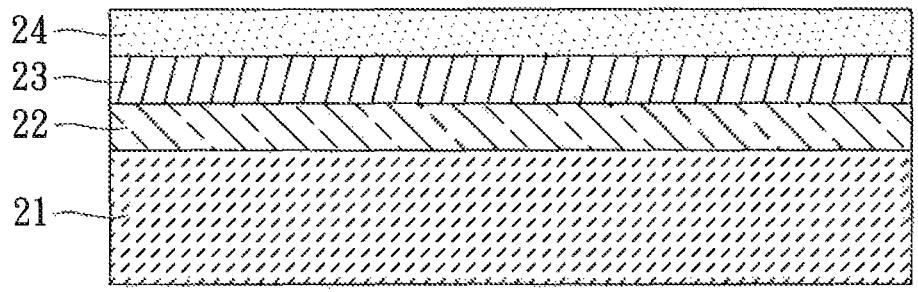
FIG. 6A to FIG. 6F are schematic cross-sectional views illustrating the manufacturing process flow of a light emitting device having auto-cloning photonic crystal structures according to another embodiment of the present invention.

Referring to FIG. 5, a manufacturing process flow (Step S51 through Step S58) of a light emitting device having auto-cloning photonic crystal structures according to another embodiment of the present invention is shown. FIG. 6A to FIG. 6F are schematic cross-sectional views illustrating the process flow of the light emitting device having auto-cloning photonic crystal structures according to the embodiment of the present invention. FIG. 6A corresponds to step S51 to step S54 in FIG. 5. Step S51 is providing a first carrier board 21. Step S52 is disposing a first semiconductor layer 22 on the first carrier board 21. Step S53 is disposing an active emitting layer 23 on the first semiconductor layer 22. Step S54 is disposing a second semiconductor layer 24 on the active emitting layer 23. The first semiconductor layer 22, the active emitting layer 23 and the second semiconductor layer 24 in step S52 through step S54 may be disposed by using chemical vapor deposition, molecular beam epitaxy or chemical liquid deposition.

Figure 6B:
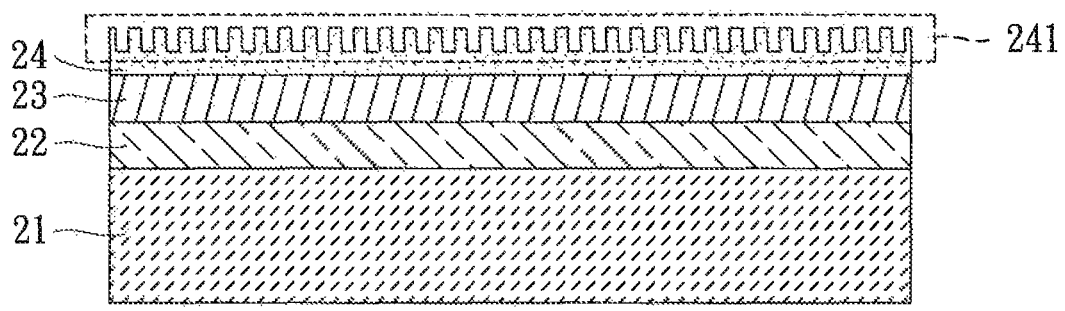
Figure 6C:
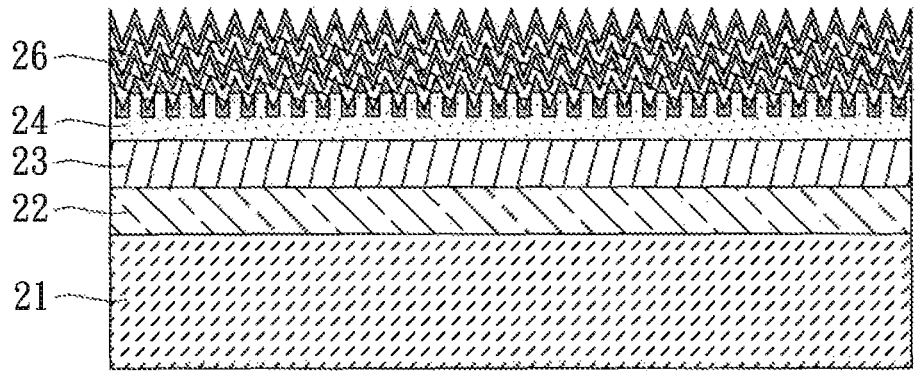

Step S55 is disposing a saw-toothed multilayer film 26 on the second semiconductor layer 24 by using a process of manufacturing auto-cloning photonic crystal structures. In one embodiment of the present invention, the process of manufacturing auto-cloning photonic crystal structures may comprise: disposing a comb pattern 241 at the upper surface of the second semiconductor layer 24 by means of photolithography, ion-beam etching, nano-imprinting or laser etching, as shown in FIG. 6B; and disposing the saw-toothed multilayer film 26 by using a thin-film process, as shown in FIG. 6C. The composition of the saw-toothed multilayer film 26 is the same as the above mentioned embodiments.

Figure 6D:
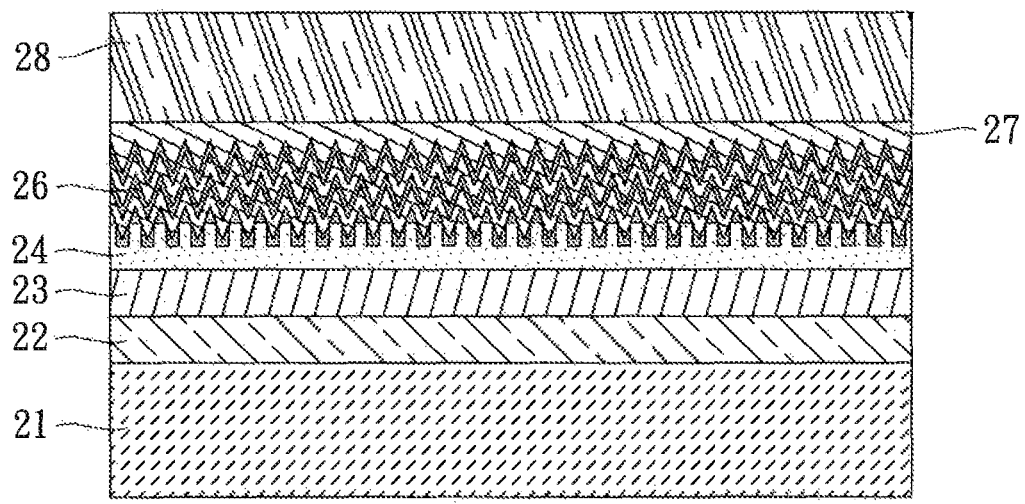
Figure 6E:
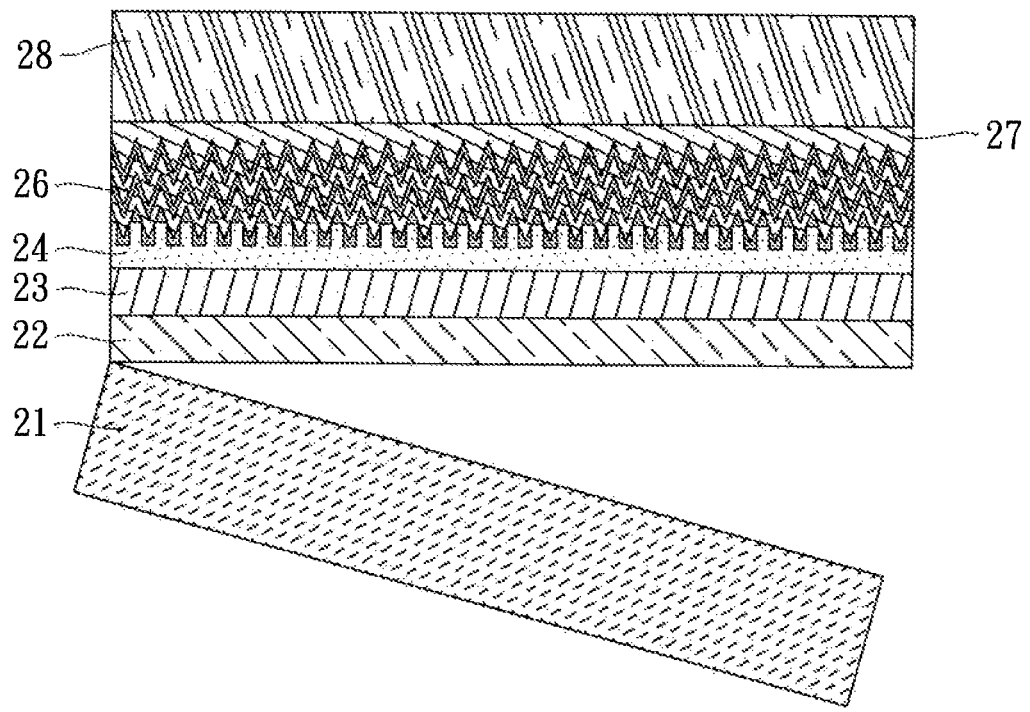
Figure 6F:
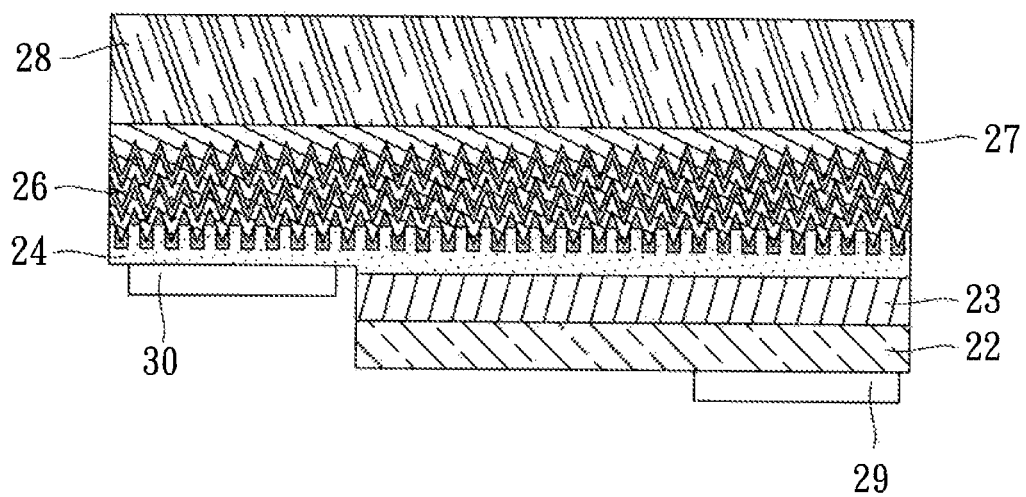

Continuing the above description, step S56 is disposing a substrate 28 on the saw-toothed multilayer film 26 by using an adhesive layer 27, as shown in FIG. 6D. The substrate 28 may comprise a material with high thermal conductivity, such as Cu or Al and etc., to enhance thermal dissipation. Step S57 is removing the first carrier board 21. Step S58 is disposing a first electrode 29 and a second electrode 30 electrically connected with the first semiconductor layer 22 and the second semiconductor layer 24 respectively, as shown in FIG. 6F. In another embodiment of the present invention, the manufacturing process flow of a light emitting device having auto-cloning photonic crystal structures further comprising a cutting process cutting the first semiconductor layer 22, the active emitting layer 23, the second semiconductor layer 24 and the saw-toothed multilayer film 26 without cutting the substrate 28, and then a plurality of units are configured in matrix after the cutting process. In another embodiment of the present invention, the manufacturing process flow of a light emitting device having auto-cloning photonic crystal structures further comprising disposing a plurality of insulating layers between these units and covering the insulating layers with the first electrode 29. It should be noted that when the first carrier board 21 is transparent with respect to light emitted by the active emitting layer 23, removing the first carrier board 21 is not necessary in step S57.

Figure 7A:
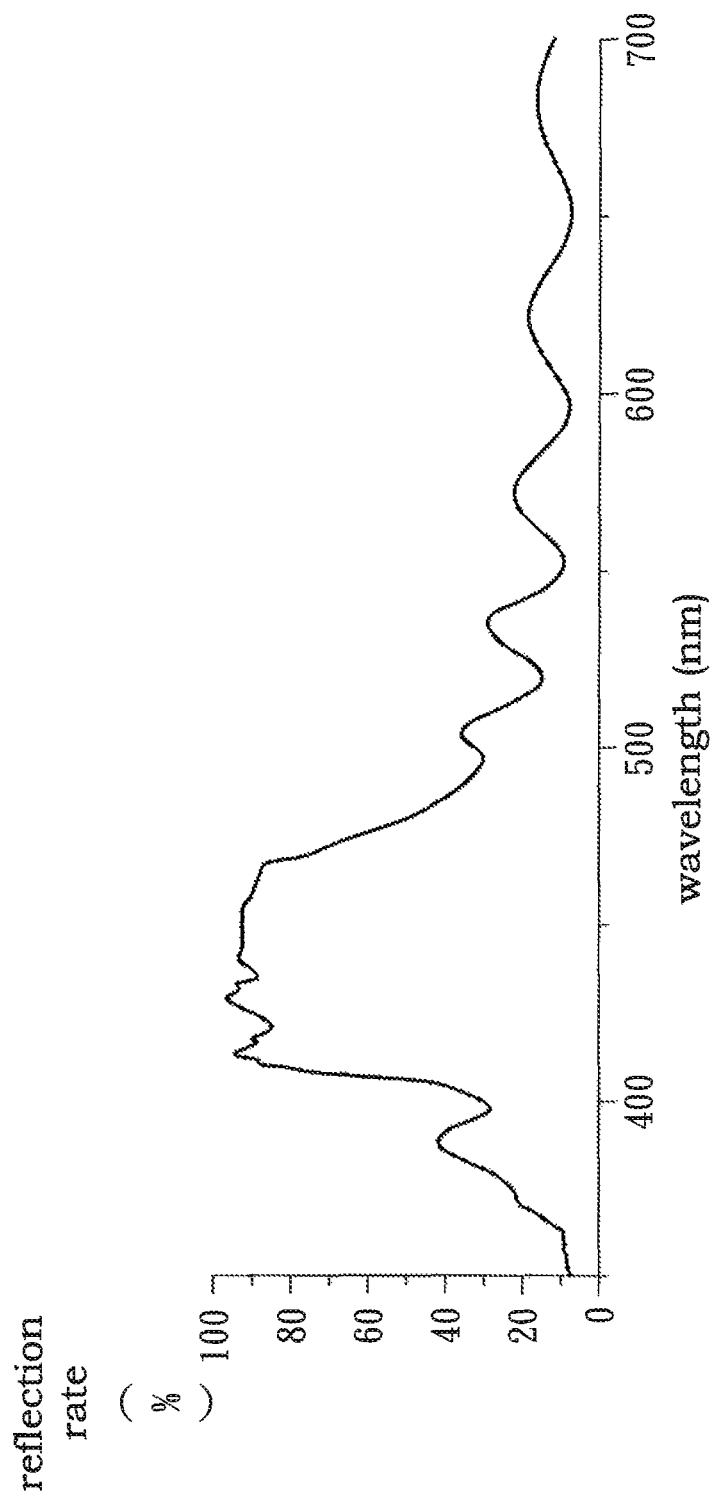
FIG. 7A is a diagram illustrating a wavelength-reflection rate relationship of a light emitting device having auto-cloning photonic crystal structures according to the present invention.
Figure 7B:
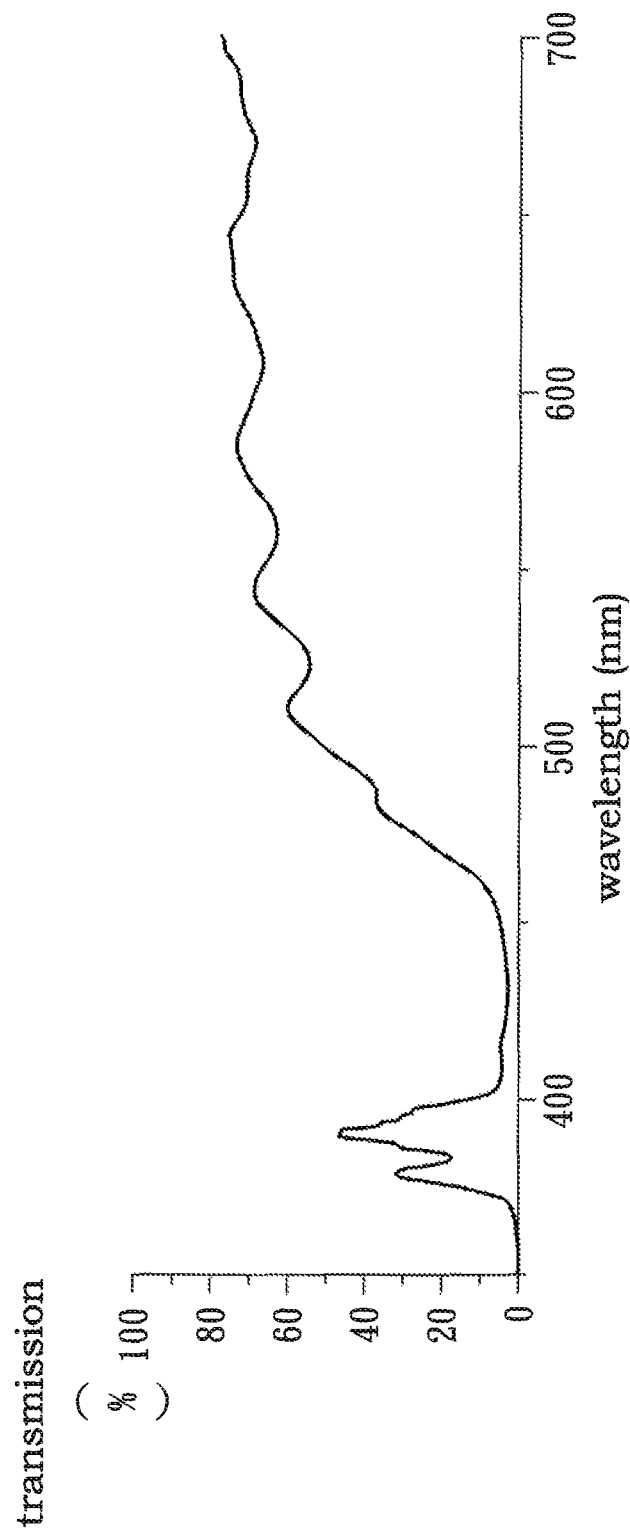
FIG. 7B is a diagram illustrating a wavelength-transmission rate relationship of a light emitting device having auto-cloning photonic crystal structures according to the present invention.

Refer to FIG. 7A and FIG. 7B, which respectively show wavelength-reflection rate and wavelength-transmission rate relationships of a light emitting device having auto-cloning photonic crystal structures according to the present invention.

In one embodiment of the present invention, the active emitting layer 23 of the light emitting device having auto-cloning photonic crystal structures emits blue light. As shown in FIG. 7A and FIG. 7B, within the range of 420-470 nm of wavelength, the reflection rate is higher than 90% and the transmission rate is lower than 10%, meaning that the saw-toothed multilayer film 26 is able to reflect most of the blue light emitted toward the substrate 28. The saw-toothed periodic structure is able to change directions of light thereby enhancing light extraction efficiency.

According to light extraction efficiency derived by the Rigorous Coupled Wave Analysis, the light extraction efficiency of a conventional light emitting diode is 12%; the light extraction efficiency of a light emitting diode having a high reflection multilayer on top is 22%, the light extraction efficiency of a light emitting diode with a saw-toothed multilayer film under the substrate is 34.8%; the light extraction efficiency of a light emitting diode with a saw-toothed multilayer film covering half of the upper surface of the substrate is 51.4%; the light extraction efficiency of the saw-toothed multilayer film entirely covers the substrate according to one embodiment of the light emitting device of the present invention is higher than 83.4%, a remarkably high light extraction efficiency.

In summary, the manufacturing method of a light emitting device having auto-cloning photonic crystal structures of the present invention provides a saw-toothed multilayer film of auto-cloning photonic crystal structures which may provide a high reflection interface and a diffraction mechanism to prevent total internal reflection and enhance light extraction efficiency.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:
1. A manufacturing method of a light emitting, device having auto-cloning photonic crystal structures comprising:
   providing a first carrier board;
   disposing a first semiconductor layer on said first carrier board;

disposing an active emitting layer on said first semiconductor layer;

disposing a second semiconductor layer on said active emitting layer;

disposing a saw-toothed multilayer film on said second semiconductor layer by using a process of manufacturing auto-cloning photonic crystal structures;

disposing a substrate on said saw-toothed multilayer film;

disposing a first electrode and a second electrode on said first semiconductor layer and said second semiconductor layer respectively.

2. The manufacturing method of a light emitting device having auto-cloning photonic crystal structures according to claim 1, wherein said first carrier board is transparent with respect to light emitted by said active emitting layer.

3. The manufacturing method of a light emitting device having auto-cloning photonic crystal structures according to claim 1, further comprising removing said first carrier board when said first carrier board is not transparent with respect to light emitted by said active emitting layer.

4. The manufacturing method of a light emitting device having auto-cloning photonic crystal structures according to claim 1, further comprising a cutting process, before disposing said first electrode and said second electrode, cutting said first carrier board, said second semiconductor layer, said active emitting layer, said first semiconductor layer, said saw-toothed multilayer film without cutting said substrate, and then a plurality of units is configured in matrix after said cutting process.

5. The manufacturing method of a light emitting device having auto-cloning photonic crystal structures according to claim 4, wherein each of said units is configured with said first electrode and said second electrode thereon electrically connected to said first semiconductor layer and said second semiconductor layer respectively.

6. The manufacturing method of a light emitting device having auto-cloning photonic crystal structures according to claim 4, further comprising disposing a plurality of insulating layers between said units.

7. The manufacturing method of a light emitting device having auto-cloning photonic crystal structures according to claim 6, wherein each of said first electrodes covers each of said insulating layers.

8. The manufacturing method of a light emitting device having auto-cloning photonic crystal structures according to claim 1, wherein said process of manufacturing auto-cloning photonic crystal structures comprises:

disposing a comb pattern at the upper surface of said second semiconductor; and disposing said saw-toothed multilayer film by using a thin-film process.

9. The manufacturing method of a light emitting device having auto-cloning photonic crystal structures according to claim 8, wherein said thin-film process comprises an ion beam sputtering process, a radio frequency magnetron sputtering process, an evaporation deposition process or a chemical vapor deposition.

10. The manufacturing method of a light emitting device having auto-cloning photonic crystal structures according to claim 1, wherein said saw-toothed multilayer film is formed by alternately stacking at least two materials with different indices of refraction.

11. The manufacturing method of a light emitting device having auto-cloning photonic crystal structures according to claim 1, wherein two different materials comprised in said saw-toothed multilayer film is selected from a group consisting of $TiO_2$, $Ta_2O_5$, $Nb_2O_5$, $CeO_2$, ZnS, ZnO, Si, $SiO_2$ and $MgF_2$.

12. The manufacturing method of a light emitting device having auto-cloning photonic crystal structures according to claim 1, further comprising disposing a transparent conducting layer between said first semiconductor layer and said first electrode or between said second semiconductor layer and said second electrode.

13. The manufacturing method of a light emitting device having auto-cloning photonic crystal structures according to claim 1, wherein said first semiconductor layer comprises, an n-type III-V semiconductor material; and said second semiconductor layer comprises a p-type III-V semiconductor material.

14. The manufacturing method of a light emitting device having auto-cloning photonic crystal structures according to claim 1, wherein said first semiconductor layer comprises a p-type III-V semiconductor material; and said second semiconductor layer comprises an n-type III-V semiconductor material.

* * * * *